United States Patent
Peterson

(10) Patent No.: US 6,662,250 B1
(45) Date of Patent: Dec. 9, 2003

(54) OPTIMIZED ROUTING STRATEGY FOR MULTIPLE SYNCHRONOUS BUS GROUPS

(75) Inventor: Melvin Peterson, Campbell, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/512,786

(22) Filed: Feb. 25, 2000

(51) Int. Cl.$^7$ .............................................. G06F 13/00
(52) U.S. Cl. ..................... 710/100; 710/104; 716/13; 716/14; 716/15
(58) Field of Search ................................ 710/100, 104, 710/105; 716/13, 14, 15; 370/419; 257/668; 174/261, 262, 52.4

(56) References Cited

U.S. PATENT DOCUMENTS

| | | | |
|---|---|---|---|
| 4,801,999 A | * 1/1989 | Hayward et al. | 257/668 |
| 4,811,073 A | * 3/1989 | Kitamura et al. | 716/15 |
| 5,590,292 A | * 12/1996 | Wooten et al. | 370/419 |
| 5,729,467 A | * 3/1998 | Katsumata et al. | 716/15 |
| 5,952,611 A | * 9/1999 | Eng et al. | 174/52.4 |
| 6,040,530 A | * 3/2000 | Wharton et al. | 174/261 |
| 6,091,310 A | * 7/2000 | Utsumi et al. | 174/262 |

OTHER PUBLICATIONS

M. Morris Mano, Computer System Architecture, 1982, Prentice–Hall, Inc., Second Edition, pp. 435–437.*
IEEE's definition of "circuit pack", the Authoritative Dictionary of IEEE Standards Terms, 7 Ed. P170.*
Webopedia's definition of "bus", http://www.webopedia.com/term/b/bus.html.*
M. Morris Mano, Computer System Architecture, 1982, Prentice–Hall, Inc., Second Edition, pp. 435–437.*

\* cited by examiner

Primary Examiner—Gopal C. Ray
Assistant Examiner—Justin King

(57) ABSTRACT

A bus routing strategy for a printed circuit board is disclosed. The routing strategy ensures that traces coupled to a plurality of synchronous devices are not routed through the center region of each package, ensures that each trace in a bus is approximately the same length, minimizes the length over which "neckdown" occurs, and ensures that traces are routed without making sharp turns. By using this routing strategy, propagation time differences within each trace group are minimized. Also, the center regions of the printed circuit board under each package are available for vias connected to bypass capacitors.

18 Claims, 4 Drawing Sheets

OPTIMIZED ROUTING STRATEGY FOR MULTIPLE SYNCHRONOUS BUS GROUPS

BACKGROUND

1. Field of the Invention

The present disclosure relates to signal routing in printed circuit boards and, in particular, to a routing strategy for multiple synchronous bus groups.

2. Description of the Related Art

Most computer systems include a number of components such as microprocessors and memory devices that are mounted to a multi-layered printed circuit board (PCB). The PCB may include multiple power, ground, and signal layers. The components are packaged in a variety of package types such as dual in-line packages (DIPs), quad flat packs (QFPs), pin grid arrays (PGAs), and ball grid arrays (BGAs). PGAs and BGAs have become popular package types since they allow for a high number of terminals on each package. The terminals are located over the entire bottom surface or a substantial portion of the surface of the device as illustrated by the terminal footprint of an exemplary 256 pin BGA package 10 in FIG. 1A.

PGAs are mounted to a PCB by inserting a plurality of pins that extend from the bottom surface of the package into corresponding sockets on, or through-holes in, the PCB. A BGA is essentially the same as a PGA except that the BGA has solder balls for soldering to corresponding pads on the surface of the PCB.

The terminals of PGAs and BGAs generally include multiple power, ground, and signal terminals. The signal terminals include data terminals, address terminals, clock terminals, control terminals as well as other signal terminals. Buses connect to the data, address, and clock terminals of the various devices. A bus generally refers to a collection of data lines and/or address lines. For example, one or more data and address buses may be used to connect several microprocessors and/or memory chips on a single PCB. If the data lines or address lines are synchronized using one or more non-common synchronous clock signals or strobes, as they are generally referred to, the bus is referred to as a synchronous bus. Synchronous buses are well known in the art.

FIG. 1B shows a conventional routing method used to route a bus between two or more BGA (or PGA) packages. One disadvantage of this routing method is that it routes signals through the center regions 14 of the BGA packages 16 and 18.

In some applications, for instance when BGA packages 16 and 18 contain microprocessors, bypass capacitors are mounted to the surface of the PCB in the center region of each BGA package. The bypass capacitors connect through vias to the underlying power and ground planes in the PCB and become distributed sources of charge to increase switching speeds when signal traces are switched between logic states. Since bus 20 is routed through the center regions 14 of BGA packages 16 and 18, this prevents vias to the power and ground planes from being formed under the center areas 14, near the capacitors, and instead requires the vias, and traces leading to the vias, to be formed in peripheral regions around the BGA packages 16 and 18. These peripheral vias require longer traces to reach the capacitors and introduce undesirable parasitics and limit the effectiveness of the bypass capacitors.

Another disadvantage associated with the conventional routing method shown in FIG. 1B is referred to as "neckdown." Neckdown is where the space between traces on the same layer must be reduced in order to navigate the array of vias when under, or in the immediate area of, the BGA or PGA packages in order to contact the package terminals and to not interfere with each other. For example, FIG. 1B shows multiple traces (bus 20) routed on a layer of a PCB. The center-to-center distance (pitch) between the traces is very small when under the BGA package 16 or 18 so that the traces will avoid pads, vias, and each other as they traverse from the left side of BGA package 16 to the right side of the other, identical, BGA package 18. Since the center-to-center distance between the traces is reduced, and the traces run side-by-side for a considerable distance (i.e., the entire width of the BGA package), undesirable effects such as cross-coupling occur, degrading the performance of the system. The negative effects of cross-coupling, in general, increase with the length of the neckdown area. Thus it is desirable to minimize the neckdown area.

Another disadvantage associated with conventional routing methods is that often the individual routed traces within a bus have different lengths. Since the individual traces have different lengths, the propagation delay of each line differs. This results in reduced timing margins and complicates the design of systems which use high speed synchronous buses. Further, as synchronous clock speeds continue to increase in modern devices, this problem becomes exacerbated.

Yet another disadvantage associated with conventional routing methods is that they often require a trace to make sharp turns. Sharp turns increase the parasitics (e.g., undesirable capacitive effects, reflections, etc.) of the transmission line. Such parasitics degrade the performance of the system.

What is needed is a routing strategy that ensures that traces are not routed through the center region of a package, that ensures that each trace in a bus is approximately the same length, that minimizes the length over which "neckdown" occurs, and that ensures that traces are routed without making sharp turns.

SUMMARY

An improved routing strategy is disclosed. One embodiment of a computer system includes a printed circuit board having one or more signal routing layers, a plurality of synchronous devices (e.g., microprocessors) mounted on the printed circuit board, and at least one synchronous bus, wherein the synchronous bus comprises traces that are coupled between the synchronous devices.

The traces connect to terminals of the devices such that they do not run under the central areas of the devices. This opens up the central area under each device for other circuitry, such as bypassing capacitors and their associated vias leading to various layers. Each trace in a synchronous bus is approximately the same length, and each device "sees" the same trace configuration.

The routing configuration can be easily extended to any number of synchronous devices sharing the same buses.

DETAILED DESCRIPTION

Figure 1A:
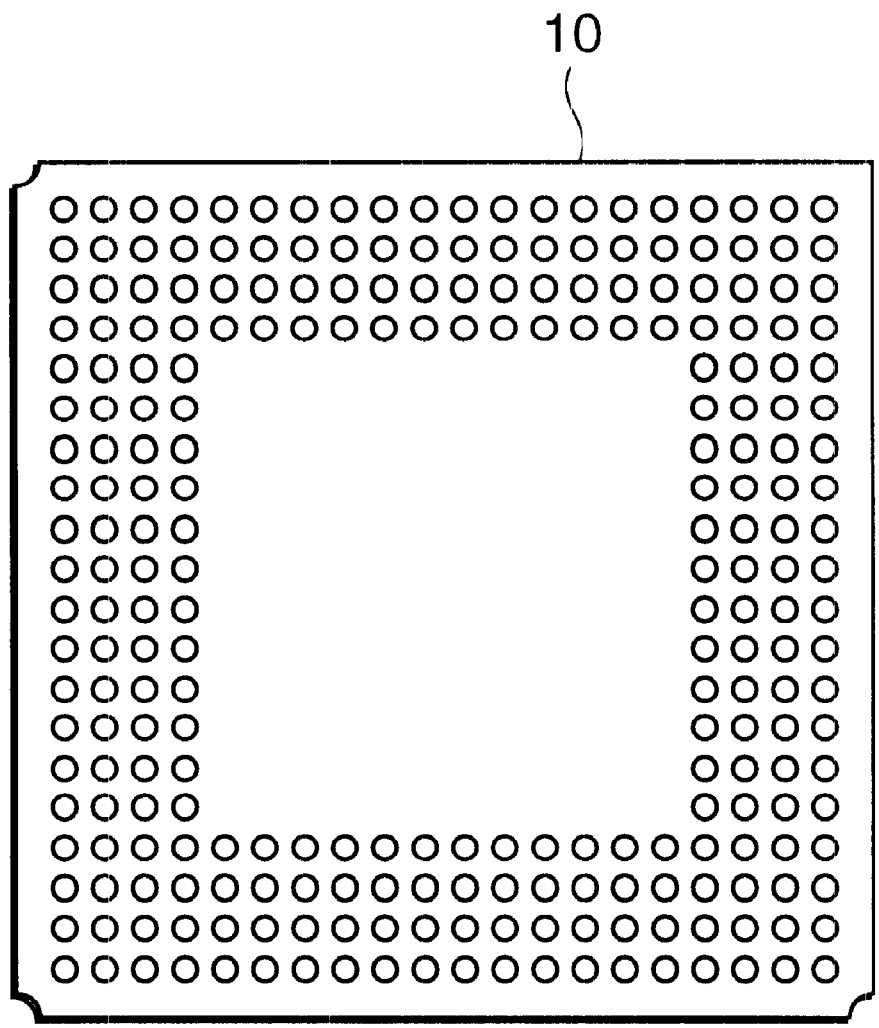
FIG. 1A shows the footprint pattern of a conventional BGA or PGA package.
Figure 1B:
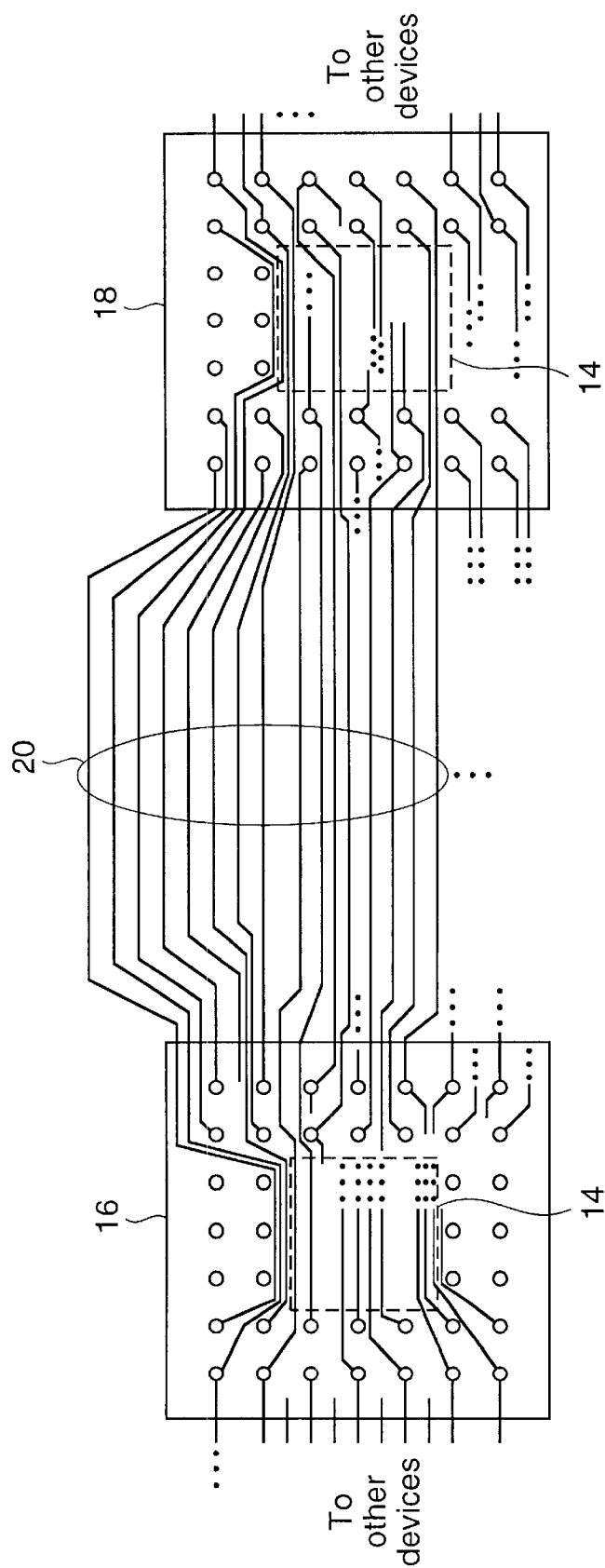
FIG. 1B shows a portion of footprint patterns of two packages and a conventional routing method, where traces are routed under the center regions of the packages.
Figure 2:
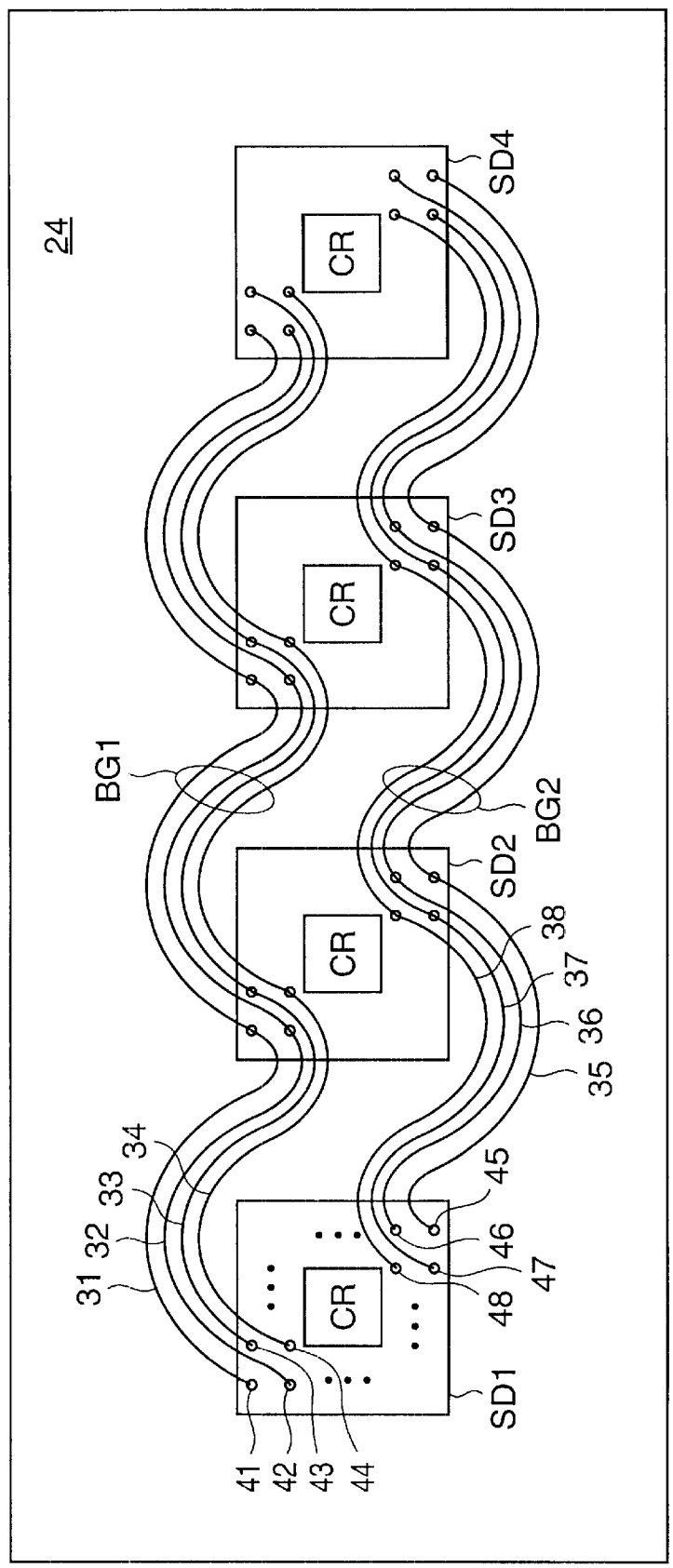
FIG. 2 is a top down view of four synchronous devices mounted on the top surface of a printed circuit board in accordance with one embodiment, with signal line traces shown.

FIG. 2 shows a top down view of four synchronous devices mounted on the top surface of a printed circuit board in accordance with one embodiment of the invention. Synchronous devices SD1, SD2, SD3, and SD4 are mounted on a multi-layer printed circuit board (PCB) 24. The synchronous devices may include any combination of synchronous devices such as microprocessors or memory devices (e.g., DRAMs). The synchronous devices may be packaged in any package type known in the art such as a PGA package or a BGA package. In one embodiment, the synchronous devices SD1–SD4 are identical microprocessors in PGA packages.

A plurality of terminals extend from the bottom of the synchronous devices and are used to electrically couple the synchronous devices with corresponding pads on the PCB 24. FIG. 2 illustrates only eight terminals on each synchronous device for the sake of clarity and simplicity. There can be hundreds or thousands of terminals for each synchronous device. The terminals on each synchronous device are connected to a semiconductor die housed within the package. The terminals include input/output (I/O) terminals, clock terminals, power terminals, and ground terminals. The I/O terminals typically include terminals for data signals, address signals, and control signals. Power and ground terminals are typically connected to power and ground planes within the PCB 24 using conductive vias.

Traces 31–38 are coupled to terminals 41–48, respectively, on each identical synchronous device. Traces 31–34 make up one bus group BG1, and traces 35–38 make up a second bus group BG2. Bus group BG1 may transmit any signals, such as data signals, plus one or more clocks (strobes), that should have the same propagation time along each of traces 31–34. Bus group BG2 may transmit a separate group of signals that require substantially identical propagation times within their group but may be different from BG1. In one embodiment, both bus groups are routed on the same PCB layer. In another embodiment, the bus groups are routed on different PCB layers. Two bus groups per layer are shown in FIG. 2, but any number of groups per layer are possible depending on the number of traces per group and the physical location of the pins.

The traces in each synchronous bus group BG1 or BG2 are routed in a symmetrical manner, such that each synchronous device "sees" the same trace configuration. In FIG. 2, the traces 31–34 exit each device SD1–SD3 under the top edge of the device and enter the following synchronous device under the left edge of the device SD2–SD4. The traces 45–48 exit each synchronous device under the right edge of the device SD1–SD3 and enter the following synchronous device under the bottom edge of the device SD2–SD4. Other configurations are possible while meeting the constrains of the present invention.

Further, each trace in a bus group has substantially the same length between terminals. By routing each trace so that it is symmetrical with each synchronous device and has substantially equal lengths, there is little skew between the signals and their strobes, thus allowing maximum clock speeds. This becomes especially important as clock speed extend upwards into the hundreds of megahertz and into the gigahertz range.

A synchronous bus group is a bus that includes one or more data lines and one or more clock/strobe lines or a bus that includes one or more address lines and one or more clock/strobe lines. The clock line(s)/traces of each synchronous bus group may be independent of the clock line(s)/traces of any other synchronous bus group. Thus each synchronous device may be coupled to a plurality of independently clocked synchronous bus groups.

In one example, synchronous bus group BG1 includes three address traces 31–33 and one clock trace 34. Synchronous bus group BG2 includes three data traces 45–47 and one clock trace 48. Clock traces 34 and 48 may transmit different clock signals.

In one embodiment, a synchronous bus group of terminals on a package consists of 16 data terminals (16 parallel data bits), 2 error bits, and two data strobe clocks. Thus, this group would have symmetrical traces on the same PCB layer since it is important that each data and clock/strobe path have the same propagation delay. In one embodiment, there are four such data groups, each being routed on a separate PCB layer, and two address groups routed on two of the PCB layers.

Traces for any number of groups may be routed on the same PCB layer if there is sufficient area.

Preferably, the traces in each individual bus group are routed without making sharp turns (e.g., 90°) to avoid any discontinuity, reflection, or parasitic effects. As shown in FIG. 2, traces 31–38 are all rounded in shape. For ease of manufacturing, angled traces (e.g., 45°) may be used.

For very high frequency applications (e.g., 400 MHz or higher), the minimum radius of the traces should be around three times the width of the trace.

The center-to-center distance (pitch) between traces in a bus group may, in general, need to be reduced when the traces extend into the via array under the synchronous devices. This reduced pitch ("neckdown") results in more noise coupling. Minimizing the distance that each trace travels under the synchronous device, as shown in FIG. 2, will minimizing cross-coupling noise.

One advantage of the routing configuration shown in FIG. 2 is that the center region CR of each device package is free of routing traces. In some applications, for example where the synchronous device is a microprocessor, bypass capacitors are located in the central area of each synchronous device and are connected by vias to the underlying power and ground planes, as discussed in the background section of this disclosure. It is advantageous to drop vias directly down into the power and ground planes in the PCB from the pads that are connected to the bypass capacitors to maximize the performance of the bypass capacitors.

FIG. 2 illustrates two bus groups being formed on the same PCB layer. When the number of terminals on a device make routing on a single layer difficult, multiple routing layers in the PCB are used. The concepts described with respect to FIG. 2 apply to each routing layer of the PCB. Vias between the top layer and each routing layer are used to couple the terminals on the package to the routing layers.

Figure 3:
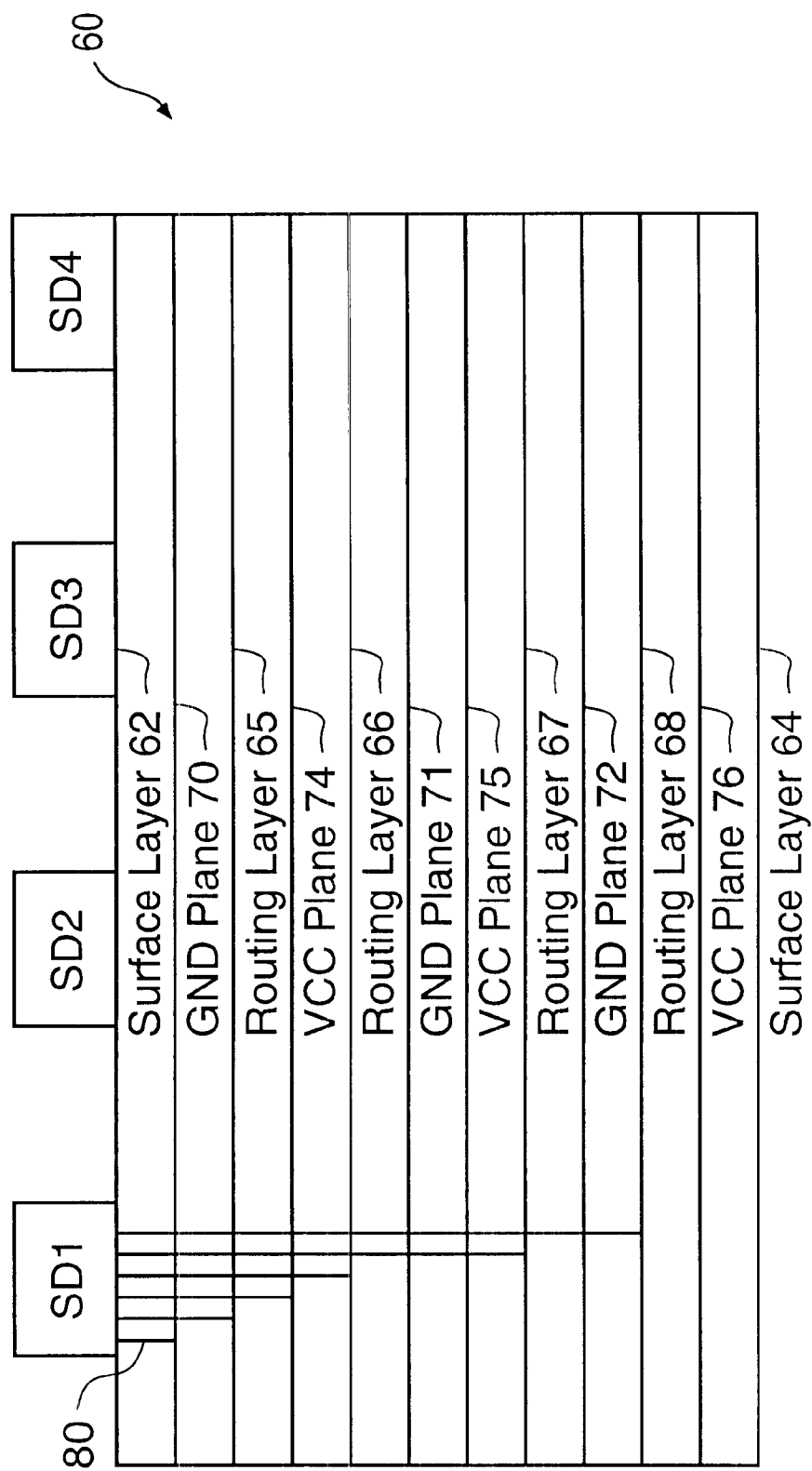
FIG. 3 is a cross-sectional view of the four synchronous devices of FIG. 2 mounted on the top surface of a 12 layer printed circuit board in accordance with one embodiment.

FIG. 3 is a cross-sectional view of four synchronous devices mounted on the top surface of a twelve layer PCB 60 in accordance with one embodiment. PCB 60 includes a top surface layer 62, a bottom surface layer 64, four routing layers 65–68, three ground (GND) planes 70–72, and three power (VCC) planes 74–76.

The synchronous devices SD1–SD4 are connected to conventional pads on the top surface layer 62. Conventional vias 80 extend down from the pads to the routing layers, ground planes, and power planes, as required, to provide the appropriate electrical connection. In one embodiment, routing layers 65–68 are used to route multiple synchronous buses. Each routing layer is isolated from neighboring routing layers by the power and ground planes surrounding the routing layers.

In one example, a first synchronous bus data group and a first synchronous bus address group are routed on routing layer 65. A second synchronous bus data group and a second synchronous address group are routed on routing layer 66. Two other synchronous bus data groups are routed on routing layer 67. A control group is routed on routing layer 68. Each group is routed in accordance with the embodiments discussed with respect to FIG. 2. For example, traces within individual bus groups have approximately the same length, the traces do not make any sharp turns, the traces maintain a minimum radius, the neckdown distance is minimized, the traces are symmetrical with respect to each synchronous device, and the traces are not routed through the center regions of the synchronous devices.

The terminals on the synchronous devices are arranged so that groups of adjacent terminals correspond to particular synchronous bus groups (e.g., 20 terminals for a data group and 20 terminals for an address group).

Although FIGS. 2 and 3 illustrate the present routing strategy applied to four synchronous devices, it is to be appreciated that any number of synchronous devices may be used. For example, as few as two devices or more than four may be used. Furthermore, the embodiments discussed in connection with FIGS. 2 and 3 have shown the synchronous devices linearly arranged on the PCB. It is to be appreciated that the routing concepts described herein apply to synchronous devices arranged on a PCB in any manner. Other arrangements include an N×M array.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An electronic system comprising:
   a printed circuit board having one or more signal routing layers;
   a plurality of synchronous devices mounted on the printed circuit board; and
   a first synchronous bus, wherein the first synchronous bus comprises a plurality of traces that are electrically coupled to terminals of the plurality of synchronous devices, wherein each trace of the first synchronous bus is routed on a same signal routing layer, wherein each trace of the first synchronous bus between terminals of adjacent synchronous devices is approximately the same length, wherein each trace of the first synchronous bus avoids an area under a central portion of each of said synchronous devices, and wherein each group of traces in said bus between adjacent synchronous devices has a configuration substantially identical to the configuration of other groups of traces in said bus between any other adjacent synchronous devices, and wherein further a radius of said groups of traces is related to a width of said groups of traces.

2. The system of claim 1 wherein the plurality of synchronous devices are microprocessors.

3. The system of claim 1 wherein the plurality of synchronous devices are packaged in pin grid array packages.

4. The system of claim 1 wherein the plurality of synchronous devices are packaged in ball grid array packages.

5. The system of claim 1 wherein the trace paths are rounded.

6. The system of claim 1 wherein the plurality of synchronous devices comprise at least three devices linearly arranged on said printed circuit board.

7. The system of claim 1 further comprising a second synchronous bus, wherein the first synchronous bus is routed on a first routing layer and the second synchronous bus is also routed on the first routing layer.

8. The system of claim 1 further comprising a second synchronous bus, wherein the first synchronous bus is routed on a first routing layer and the second synchronous bus is routed on a second routing layer.

9. The system of claim 1 further comprising a second synchronous bus, wherein each trace of the first synchronous bus is approximately the same length as each trace of the second synchronous bus.

10. The system of claim 1 wherein the plurality of synchronous devices comprise a first synchronous device, a second synchronous device, and a third synchronous device, wherein each of the first, second, and third synchronous devices have a first edge, a second edge, a third edge, and a fourth edge, wherein the traces of the first synchronous bus exit under the first edge of the first synchronous device, enter under the fourth edge of the second synchronous device, exit under the first edge of the second synchronous device, and enter under the fourth edge of the third synchronous device.

11. The system of claim 1 wherein said first synchronous bus comprises data signal traces and at least one clock trace.

12. The system of claim 1 wherein said first synchronous bus is only connected to terminals on each of said synchronous devices that are adjacent to one another.

13. An electronic system comprising:
    a multi-layer printed circuit board having first, second, third, and forth signal routing layers;
    first, second, third, and fourth microprocessors mounted on the printed circuit board in a linear array;
    a plurality of synchronous buses, wherein each synchronous bus comprises a plurality of traces, wherein traces for each synchronous bus are connected to adjacent terminals on each of the first, second, third and fourth microprocessors mounted on the printed circuit board in a linear array; a plurality of synchronous buses, wherein each synchronous bus comprises a plurality of traces, wherein traces for each synchronous bus are connected to adjacent terminals on each of the first, second, third, and fourth microprocessors, wherein each trace of a synchronous bus is routed on a single signal routing layer, wherein each trace in a synchronous bus is approximately the same length, wherein each trace of the first synchronous bus avoids an area under a central portion of each of said synchronous devices, and wherein each group of traces in said bus between adjacent synchronous devices has a configuration substantially identical to the configuration of other groups of traces in said bus between any other adjacent synchronous devices, and wherein further a radius of said groups of traces is related to a width of said groups of traces.

14. The system of claim 13, wherein the multi-layer printed circuit board comprises:
    a top surface layer;
    a first ground plane adjacent to the top surface layer;
    a first signal routing plane adjacent to the first ground plane;

a first power plane adjacent to first signal routing layer;

a second signal routing layer adjacent to the first power plane;

a second ground plane adjacent to the second signal routing layer;

a second power plane adjacent to the second ground plane;

a third signal routing layer adjacent to the second power plane;

a third ground plane adjacent to the third signal routing layer;

a fourth signal routing layer adjacent to the third ground plane;

a third power plane adjacent to the fourth signal routing layer;

a second surface layer adjacent to the third power plane; and vias connecting terminals of said microprocessors to various routing layers and planes in said printed circuit board.

15. The system of claim 13 wherein the plurality of synchronous buses comprises:

four synchronous data buses; and two synchronous address buses.

16. The system of claim 13 wherein each synchronous bus has at least one independent clock signal trace.

17. The system of claim 13 wherein the microprocessors are packaged in ball grid array packages.

18. The system of claim 13 wherein the microprocessors are packaged in pin grid array packages.

* * * * *

UNITED STATES PATENT AND TRADEMARK OFFICE
CERTIFICATE OF CORRECTION

PATENT NO. : 6,662,250 B1
DATED : December 9, 2003
INVENTOR(S) : Melvin Peterson It is certified that error appears in the above-identified patent and that said Letters Patent is hereby corrected as shown below:

Column 6,
Line 37, delete "forth" and insert therefor -- fourth --.

Signed and Sealed this

Eighth Day of February, 2005

JON W. DUDAS
*Director of the United States Patent and Trademark Office*